United States Patent
Saether

(10) Patent No.: US 7,274,999 B1
(45) Date of Patent: Sep. 25, 2007

(54) BROWNOUT DETECTOR SYSTEM AND METHOD

(75) Inventor: Terje Saether, Trondheim (NO)

(73) Assignee: ATMEL Corporation, San Jose, CA (US)

( * ) Notice: Subject to any disclaimer, the term of this patent is extended or adjusted under 35 U.S.C. 154(b) by 0 days.

(21) Appl. No.: 11/373,050

(22) Filed: Mar. 10, 2006

(51) Int. Cl.
G01R 31/00 (2006.01)
H03L 7/00 (2006.01)

(52) U.S. Cl. .................. 702/58; 702/65; 327/143
(58) Field of Classification Search ............... 702/57, 702/58, 59, 64, 65, 99, 182, 185; 307/34, 307/37; 327/77, 80, 83, 142, 143
See application file for complete search history.

(56) References Cited

U.S. PATENT DOCUMENTS

| | | | |
|---|---|---|---|
| 4,713,553 A * | 12/1987 | Townsend et al. | ............ 307/64 |
| 5,187,389 A | 2/1993 | Hall et al. | |
| 5,315,533 A * | 5/1994 | Stich et al. | ............ 700/298 |
| 5,546,300 A | 8/1996 | Lee et al. | |
| 5,606,511 A | 2/1997 | Yach | |
| 6,107,985 A | 8/2000 | Walukas et al. | |
| 6,181,173 B1 | 1/2001 | Homol et al. | |
| 6,256,007 B1 | 7/2001 | Walukas et al. | |
| 6,304,823 B1 | 10/2001 | Smit et al. | |
| 6,522,981 B2 | 2/2003 | Smit et al. | |
| 6,894,544 B2 * | 5/2005 | Gubbins | ............ 327/143 |
| 6,985,811 B2 * | 1/2006 | Gronemeyer | ............ 701/213 |
| 2003/0191596 A1 | 10/2003 | Smit et al. | |

FOREIGN PATENT DOCUMENTS

EP   1 460 518   9/2004
JP   2002165155   6/2002

OTHER PUBLICATIONS

"The Art of Electronics, Second Edition", by Horowitz et al., copyright Cambridge University Press 1980, 1989, Second Edition published 1989, pp. 335-341.

* cited by examiner

Primary Examiner—Bryan Bui
(74) Attorney, Agent, or Firm—Fish & Richardson P.C.

(57) ABSTRACT

A circuit for detecting a brownout condition may include a temperature compensating circuit that provides a temperature compensated brownout reference voltage and an input signal to compare with the brownout reference voltage. Additionally, the detection circuit may include a comparator to generate a brownout indicator if the input signal crosses the brownout reference voltage. In certain implementations, the temperature compensating circuit has two branches connected in parallel. A first branch provides the reference voltage substantially independent of temperature, and a second branch provides the input signal, which is an indication of a supply voltage. The first branch is coupled to a first input of the comparator, and the second branch is coupled to a second input of the comparator. Additionally, the temperature compensating circuit may include a third branch that has components to adjust the reference voltage.

23 Claims, 5 Drawing Sheets

BROWNOUT DETECTOR SYSTEM AND METHOD

FIELD

The present invention relates generally to electrical circuits.

BACKGROUND

A brownout detector is a device that can be used, for example, in a computing device, to detect when supplied power to the device falls below a predetermined threshold level. Some conventional brownout detectors use a comparator to compare a power supply voltage with a bandgap reference voltage provided by a bandgap circuit. If the divided power supply voltage drops below the bandgap reference voltage, the comparator output signal can be used to indicate a brownout. The bandgap circuit can provide a temperature compensated voltage threshold, referred to as the bandgap reference voltage. The bandgap circuit may require several components including diodes, resistors, and an amplifier to generate a voltage threshold independent of temperature changes.

SUMMARY

A circuit for detecting a brownout condition may include a temperature compensating circuit that provides a temperature compensated brownout reference voltage and an input signal to compare with the brownout reference voltage. Additionally, the detection circuit may include a comparator to generate a brownout indicator if the input signal crosses the brownout reference voltage. In certain implementations, the temperature compensating circuit has two branches connected in parallel. A first branch provides the reference voltage substantially independent of temperature, and a second branch provides the input signal, which is an indication of a supply voltage. The first branch is coupled to a first input of the comparator, and the second branch is coupled to a second input of the comparator. Additionally, the temperature compensating circuit may include a third branch that has components to adjust the reference voltage.

In other implementations, a method for brownout detection is described. The method includes setting a brownout threshold voltage using a first branch of a temperature compensating circuit. The brownout threshold voltage is substantially independent of temperature changes. The method includes providing a second voltage using a second branch of the temperature compensating circuit in parallel with the first branch. The second voltage indicates a power supply voltage. The method also includes generating a signal from a comparator when the second voltage crosses the brownout threshold voltage. The brownout threshold voltage is coupled to a first input of the comparator and the second voltage is coupled to a second input of the comparator.

In yet other implementations, a circuit is described that includes a detection component to detect a crossing of a reference voltage by an input voltage, and a temperature compensating circuit to generate the reference voltage. The temperature compensating circuit includes two circuit branches connected in parallel and separately coupled to the detection component, a first circuit branch to generate the reference voltage being substantially independent of temperature, and a second circuit branch to generate the input voltage.

In other implementations, a method for brownout detection is described. The method includes setting a brownout threshold voltage, maintaining the brownout threshold voltage substantially independent of temperature changes including compensating temperature changes in parallel circuit elements to substantially maintain the brownout threshold voltage at a substantially constant level, evaluating a second voltage indicative of a power supply voltage, and generating a signal when the second voltage crosses the brownout threshold voltage.

The systems and techniques described here may provide one or more of the following advantages. First, a temperature compensated reference voltage may be provided without the use of a bandgap circuit, which may reduce the number of components in the system. Second, accuracy of a brownout detector may be maintained with less expensive and complex components. Third, a system may provide a temperature compensated reference signal and require less power consumption. Fourth, a system may include components that facilitate an adjustable brownout threshold.

The details of one or more embodiments are set forth in the accompanying drawings and the description below. Other features, aspects, and advantages of the embodiments will be apparent from the description and drawings, and from the claims.

DESCRIPTION OF DRAWINGS

Like reference symbols in the various drawings indicate like elements.

DETAILED DESCRIPTION

A brownout detector can be used to monitor a power supply voltage in a computing device. The brownout detector can provide a signal, in the form of a voltage level, when the power supply voltage drops below a predefined voltage threshold. In some implementations, a circuit that includes solely resistors and diodes can generate a temperature compensating voltage threshold. A comparator can be used to compare the voltage threshold to a power supply voltage or a voltage derived from the power supply voltage. If the power supply voltage drops below the voltage threshold, the comparator can generate an output signal to indicate a brownout. In some embodiments, the computing device uses the brownout indicator to initiate a series of lower power routines, such as performing an orderly shutdown of the device or powering down non-essential components to preserve operating power.

Figure 1:
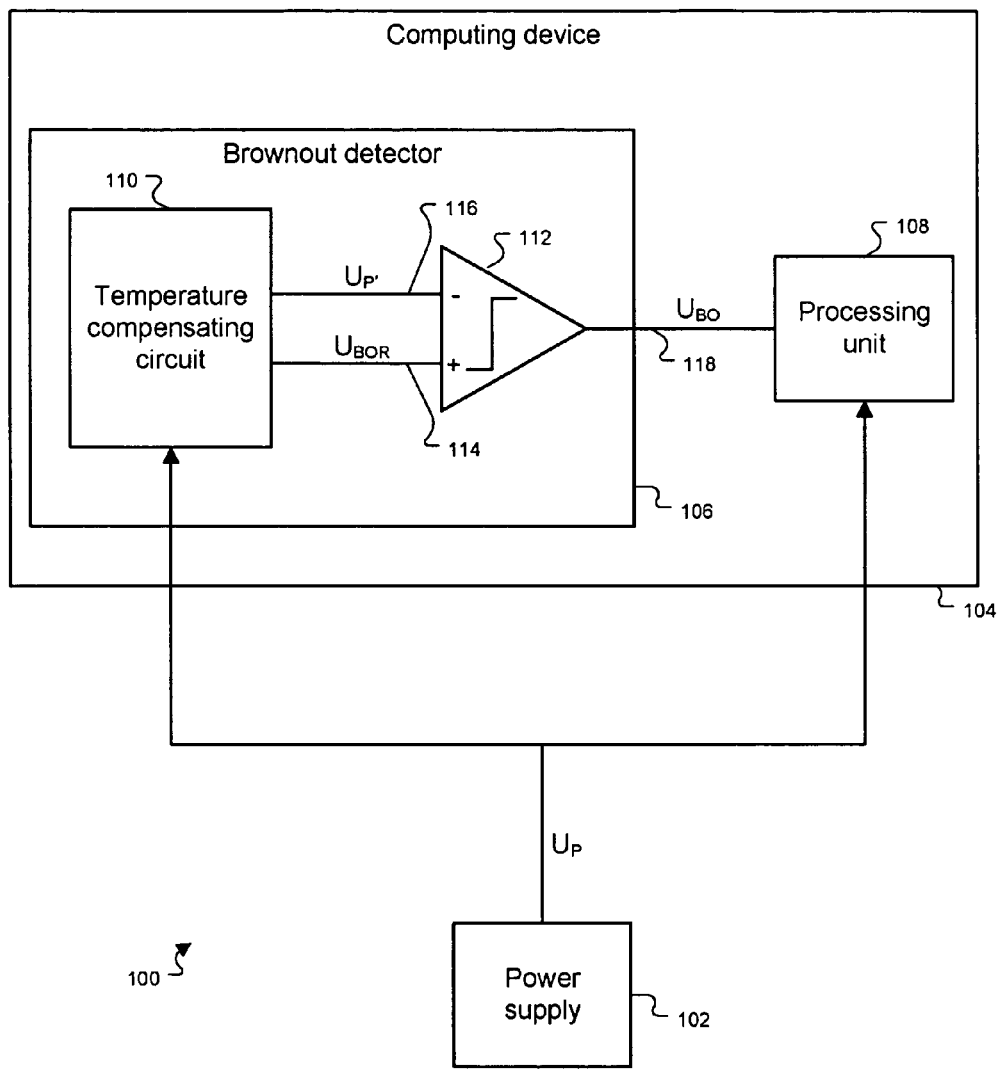
FIG. 1 is a block diagram of an exemplary system for detecting brownouts that includes a temperature compensation circuit.

FIG. 1 is a block diagram of an exemplary system 100 for detecting brownouts. The system 100 includes a power supply 102 and a device. In the example shown, the device is a computing device 104, though other devices are possible. By way of example reference will be made to an implementation that is included in a computing device.

Those of ordinary skill in the art will recognize that the circuits and methods disclosed can be used with other devices.

The power supply 102 can be used to supply power to the computing device for its operation. The power supply 102 can supply a signal having a voltage level, $U_P$. The computing device 104 can include a brownout detector 106 and a processing unit 108. The computing device 104 can utilize the processing unit 108 to control, monitor, and execute operations. The brownout detector 106 can include a temperature compensating circuit 110 and a comparator 112. The temperature compensating circuit 110 and the processing unit 108 can receive the output signal of the power supply 102 as an input signal with the voltage level, $U_P$.

The temperature compensating circuit 110 can provide a temperature compensated voltage reference to an input 114 of the comparator 112. In some implementations, temperature compensation can be achieved in the circuit as temperature increases by the summation of an increasing voltage level and a decreasing voltage level. The net change in voltage over temperature can be approximately zero. For example, voltage across diodes included in the circuit may decrease at a rate of approximately 2 mV/K (process dependent) as the temperature increases:

$$V_D = k_1 \cdot (T - T_0) + V_{D0}$$

A bandgap reference circuit exploits this by making a current that is proportional with absolute temperature (PTAT):

$$I_{PTAT} = \frac{1}{R_2} \cdot \left( \frac{k_B \cdot T}{q} \cdot \ln(A) \right)$$

When this current is run through a resistor and a diode in series the following equation is obtained:

$$V_{BGAP} = V_D + R_3 \cdot I_{PTAT}$$

Here the first term decreases with increasing temperature, while the second term increases with temperature. These voltages may be designed to cancel out and give a constant voltage, which has the equation:

$$U_{BOR} = k_1 \cdot (T - T_0) + V_{D0} + \frac{R_3}{R_2} \cdot \left( \frac{k_B \cdot T}{q} \cdot \ln(A) \right)$$

The temperature compensated voltage reference is referred to here as a brownout reference level, $U_{BOR}$. The brownout reference level can be used to detect a decrease or loss of supplied power. This detection can occur when the supplied power (e.g., from power supply 102) crosses the brownout threshold level. The temperature compensating circuit 110 can also provide a signal ($U_{P'}$), which indicates the current level of the power supply 102. In some implementations, the signal ($U_{P'}$) is a divided power supply voltage generated by a voltage divider in temperature compensating circuit 110 and is provided to an input 116 of comparator 112. The comparator 112 can determine when the power supply signal $U_{P'}$ (e.g., the divided power supply voltage level) falls below or exceeds the temperature compensated brownout reference $U_{BOR}$. When this occurs, the comparator 112 can cause a comparator output 118 to transition from a first voltage level to a second voltage level. For example, the first voltage level may be substantially 2.5 volts and the second voltage level may be substantially zero volts. The signal output 118 of the comparator 112 is referred to here as a brownout indicator signal, $U_{BO}$.

In some implementations, the computing device 104 uses the brownout indicator signal to control its operation under lower power supply conditions. In other implementations, the computing device 104 uses the brownout indicator signal to determine when the computing device is being powered up. In this case, the output 118 may transition from substantially zero to substantially 2.5 volts. The computer device 104 can use this output signal $U_{BO}$ to initiate power up events, such as resetting the processing unit 108 to a default state.

Figure 2:
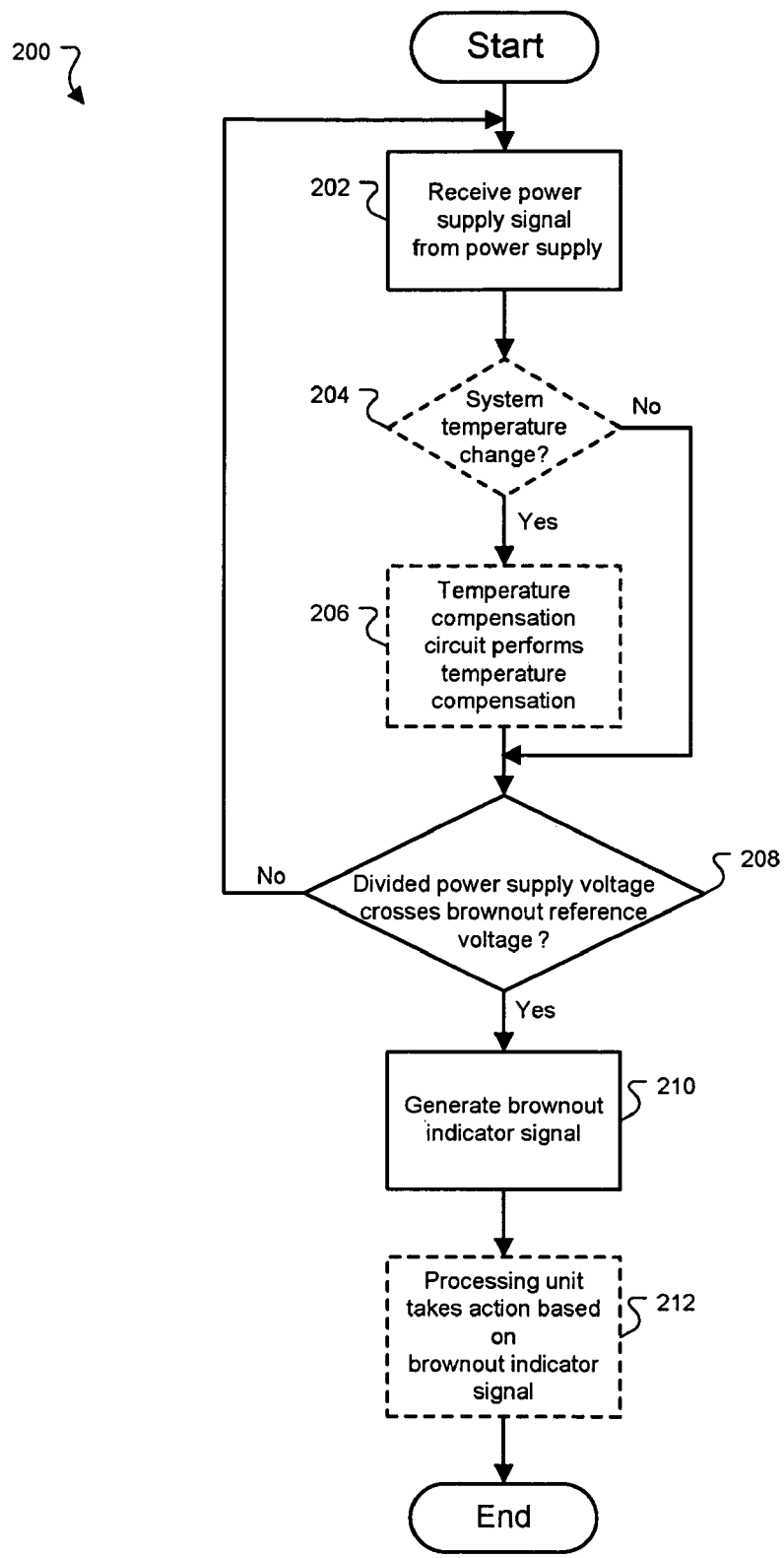
FIG. 2 is a flow chart of an exemplary method for detecting brownouts using the system of FIG. 1.

FIG. 2 is a flow chart of an exemplary method 200 for detecting brownouts using the system of FIG. 1. The method 200 begins at step 202 when the computing device 104, as described with reference to FIG. 1, receives a power supply signal from, for example, the power supply 102. The temperature compensating circuit 110 receives the power supply signal as an input.

Under some conditions, a system temperature change may be detected, as shown in an optional step 204. If there has been a system temperature change, in step 206, the temperature compensating circuit will perform temperature compensation. For example, the circuit may increase in temperature as it functions. Current flowing through the circuit's components may experience resistance, which creates heat. As some of the components of the temperature compensating circuit 110 become hotter, these components may contribute to an increase in the output voltage of the circuit. Simultaneously, as other components of the temperature compensating circuit 110 become hotter, they may contribute to a decrease in the output voltage of the temperature compensating circuit 110. Because of the opposite, or compensating, changes in voltages, the net output voltage may remain constant regardless of the temperature changes within the circuit. More details of this compensation are described in association with FIG. 3.

After the step 206 or if a system temperature change is not detected in step 204, the method 200 proceeds to step 208. In step 208, it is determined if the power supply voltage (e.g., the divided power supply voltage, which is the input 116 of comparator 112) crosses the brownout reference voltage (which is the input 114 of comparator 112). If this occurs, in step 210, a brownout indicator signal is generated. For example, the brownout indicator signal can be the signal output 118 of comparator 112. The processing unit 108 can receive the brownout signal indicator from the signal output 118 of the comparator 112.

Optionally, in step 212, the computing device 104 may take action based upon the brownout indicator signal. For example, the computing device may power down nonessential components so that functionality can be maintained by the processing unit 108 at the lower power supply voltage level. The method 200 then ends.

If, in step 208, it is determined that the power supply voltage did not cross the brownout reference voltage, the method 200 proceeds to step 202 where it continues to receive the power supply signal from the power supply.

Figure 3:
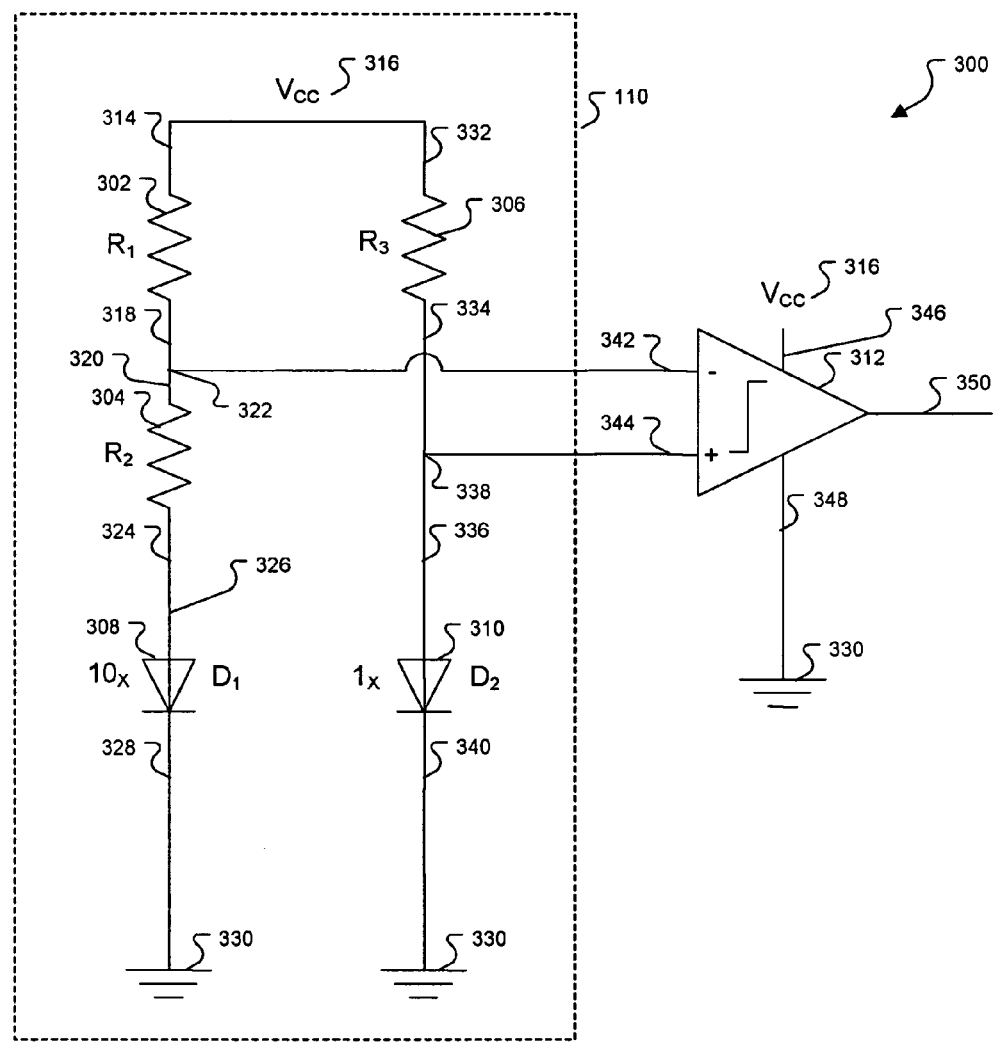
FIG. 3 is a schematic of an exemplary temperature compensating brownout circuit.

FIG. 3 is a schematic of an exemplary temperature compensating brownout circuit 300. The temperature compensating circuit 110 of the brownout circuit 300 includes resistors $R_1$ 302, $R_2$ 304, and $R_3$ 306, and diodes $D_1$ 308 and $D_2$ 310. Outputs of the temperature compensating circuit 110 are coupled to inputs of a comparator 312.

In a first branch of the temperature compensating circuit 110, terminal 314 of resistor $R_1$ 302 is coupled to a power supply voltage $V_{CC}$ 316. Terminal 318 of resistor $R_1$ 302 is coupled to terminal 320 of resistor $R_2$ 304 at node 322. Terminal 324 of resistor $R_2$ 304 is coupled to an anode 326 of diode $D_1$ 308. A cathode 328 of diode $D_1$ 308 is connected to a power supply ground 330.

In a second branch of the temperature compensating circuit 110, terminal 332 of resistor $R_3$ 306 is also coupled to the power supply voltage $V_{CC}$ 316. Terminal 334 of resistor $R_3$ 306 is coupled to an anode 336 of diode $D_2$ 310 at node 338. A cathode 340 of diode $D_2$ 310 is connected to the power supply ground 330. In this way, the first and second branches of the temperature compensated circuit are connected in parallel because they share a connection to the power supply voltage $V_{CC}$ 316 at one end and the ground point 330 at the other end.

Node 322 is coupled to a negative or inverting input 342 of comparator 312. The negative input 342 of comparator 312 is referred to as $U_P$, described in reference to FIG. 1. The negative input 342 is an indication of the current power supply voltage. Node 338 is coupled to a positive or non-inverting input 344 of comparator 312.

The positive input 344 of comparator 312 is referred to as a brownout reference level, $U_{BOR}$, described in reference to FIG. 1. The brownout reference level sets a threshold, which when crossed indicates a brownout condition. An output 350 of the comparator 312 is the brownout indicator signal, $U_{BO}$, described in reference to FIG. 1. The comparator 312 is powered by the power supply voltage $V_{CC}$ 316 at terminal 346 and is grounded by the power supply ground 330 at terminal 348.

Current through a diode as a function of temperature and diode voltage can be characterized by the following equation:

$$I(V_D, T) = I_S \cdot e^{\frac{V_D}{k_B \cdot \frac{T}{q}}}$$

where

Boltzmann's constant, $k_B = 1.38 \cdot 10^{-23}$
Electron voltage, $q = 1.6 \cdot 10^{-19}$
Temperature, T
Diode voltage, $V_D$
Saturation current (process dependent), $I_S$ Voltage across a diode may not change significantly as a function of the current through it. Therefore, the voltage across a diode can be approximated by the following equation:

$$V_D(T) = k_1 \cdot (T - T_0) + v_{D0}$$

where

Temperature, T
Room temperature, $T_0 = 300$ K
Diode voltage, $V_D$
Diode voltage at room temperature (which is process dependent), $V_{D0} = 0.65$ V The equation above, therefore, may be used to characterize the voltage at the anode 326 of diode $D_1$ 308 and the voltage at the anode 336 of diode $D_2$ 310. In some implementations, the value of resistor $R_1$ 302 and resistor $R_3$ 306 can be selected in the temperature compensating brownout circuit 300 such that they are equal to each other. The brownout reference level, $U_{BOR}$, for the temperature compensating brownout circuit 300 can be calculated as follows:

$$U_{BOR} = k_1 \cdot (T - T_0) + V_{D0} + \frac{R_3}{R_2} \cdot \left(\frac{k_B \cdot T}{q} \cdot \ln(A)\right)$$

where

Boltzmann's constant, $k_B = 1.38 \cdot 10^{-23}$
Electron voltage, $q = 1.6 \cdot 10^{-19}$
Temperature, T
Room temperature, $T_0 = 300$ K
Diode voltage at room temperature (process dependent), $V_{D0} = 0.65$ V
Diode voltage temperature gradient (process dependent), $k_1 = -2$ mV/K
Area Ratio between diodes (chosen by designer), A=10

The selection of A may be based on several factors. For example, if A is too low the ratio R3/R2 is large, which may cause the circuit to have high power consumption and poor accuracy. If A is too large, however, there may be problems with silicon area and leakage currents through the diodes connected in parallel. In some embodiments, the selection of a ratio of substantially 10 for A provides a balance between a value that is too large or too small.

In order for the brownout reference level, $U_{BOR}$, to be independent of temperature, T, the values of resistor $R_3$ 306 and resistor $R_2$ 304 can be selected such that:

$$\frac{R_3}{R_2} \cdot \left(\frac{k_B}{q} \cdot \ln(A)\right) = -k_1$$

where

Boltzmann's constant, $k_B = 1.38 \cdot 10^{-23}$
Electron voltage, $q = 1.6 \cdot 10^{-19}$
Diode voltage temperature gradient (process dependent), $k_1 = -2$ mV/K
Ratio between diodes (chosen by designer), A=10

The brownout reference level, $U_{BOR}$, therefore is:

$$U_{BOR} = V_{D0} - k_1 T_0 = 1.25 \text{ volts}$$

where

Room temperature, $T_0 = 300$ K
Diode voltage at room temperature (process dependent), $V_{D0} = 0.65$ V
Diode voltage temperature gradient (process dependent), $k_1 = -2$ mV/K If the power supply voltage $V_{CC}$ 316 is forced lower than the brownout reference level, $U_{BOR}$, the voltage level at node 322 will be lower than the voltage level at node 338. Therefore, the negative input 342 of the comparator 312 is forced lower than the positive input 344 of the comparator 312, causing the output 350 of the comparator 312 to transition indicating a brownout condition. In this example, if the power supply voltage $V_{CC}$ 316 is below 1.25 volts, a brownout indication will occur.

Figure 4:
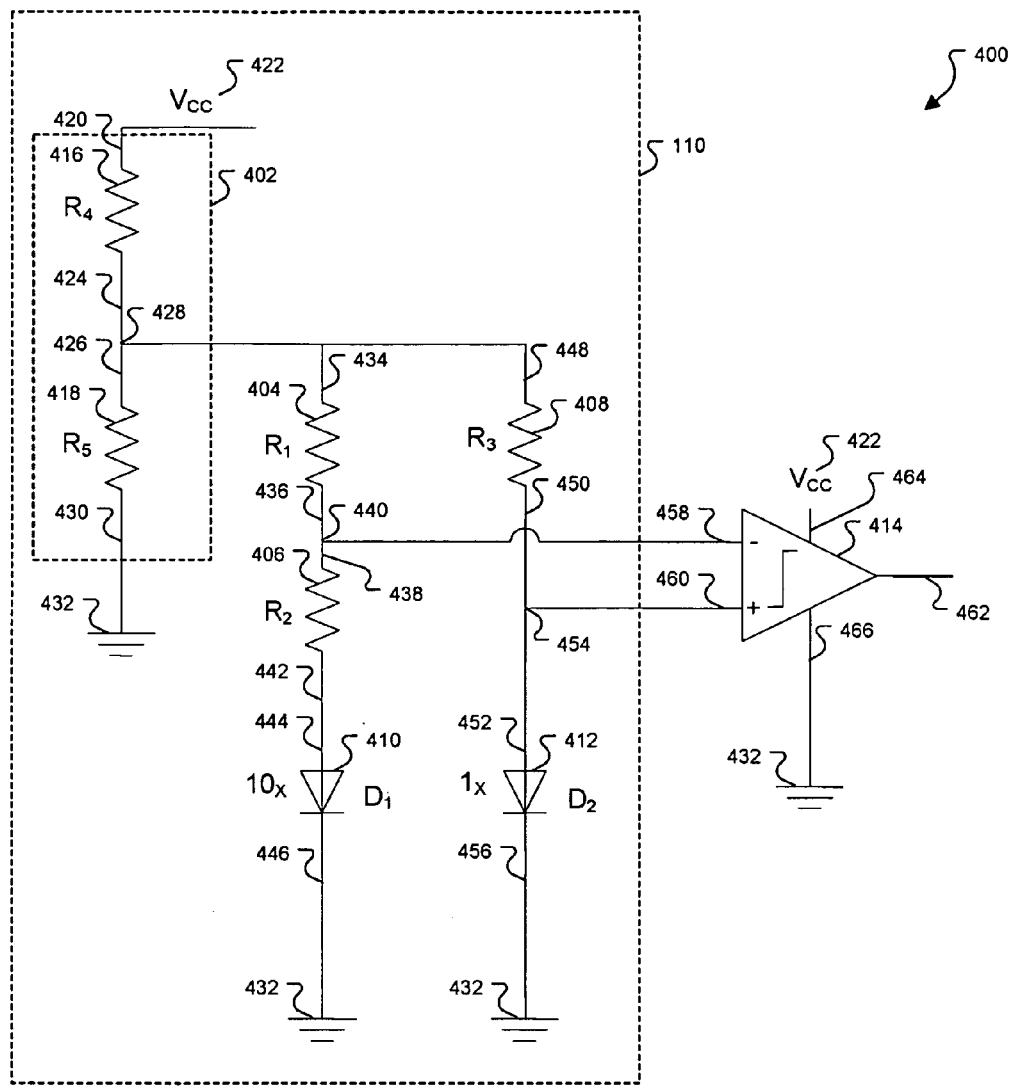
FIG. 4 is a schematic of an exemplary temperature compensating brown out circuit having a variable brownout voltage reference.

FIG. 4 is a schematic of an exemplary temperature compensating brown out circuit 400 having a variable brownout voltage reference. In the circuit of FIG. 3, the brownout voltage is fixed at approximately 1.25 volts. The temperature compensating brownout circuit 400 includes a voltage divider 402 coupled to the temperature compensating circuit 110, which facilitates changing the brownout voltage reference level. Variation in the resistor values of the voltage divider 402 permits the temperature compensating circuit 110 to specify the brownout reference level.

In this example, the temperature compensating circuit 110 includes the voltage divider 402, resistors $R_1$ 404, $R_2$ 406, and $R_3$ 408, and diodes $D_1$ 410 and $D_2$ 412. Outputs of the temperature compensating brownout circuit 400 are coupled to inputs of a comparator 414.

The voltage divider 402 includes a resistor $R_4$ 416 and a resistor $R_5$ 418. Terminal 420 of resistor $R_4$ 416 is coupled to a power supply voltage $V_{CC}$ 422. Terminal 424 of resistor $R_4$ 416 is coupled to terminal 426 of resistor $R_5$ 418 at node 428. Terminal 430 of resistor $R_5$ 430 is coupled to a power supply ground 432.

In a first branch of the temperature compensating circuit 110, terminal 434 of resistor $R_1$ 404 is coupled to a node 428 of the voltage divider 402. Terminal 436 of resistor $R_1$ 404 is coupled to terminal 438 of resistor $R_2$ 406 at node 440. Terminal 442 of resistor $R_2$ 406 is coupled to an anode 444 of diode $D_1$ 410. A cathode 446 of diode $D_1$ 410 is connected to the power supply ground 432.

In a second branch of the temperature compensating brownout circuit 400, terminal 448 of resistor $R_3$ 408 is also coupled to node 428. Terminal 450 of resistor $R_3$ 408 is coupled to an anode 452 of diode $D_2$ 412 at node 454. A cathode 456 of diode $D_2$ 412 is connected to the power supply ground 432.

The voltage divider 402 may be considered a third branch of the temperature compensating circuit 110, which is coupled to the first and second branches at the node 428.

Node 440 is coupled to a negative or inverting input 458 of comparator 414. The negative input 458 of comparator 414 is referred to as $U_P$, similarly described in reference to FIG. 1. Node 454 is coupled to a positive or non-inverting input 460 of comparator 414. The positive input 460 of comparator 414 is referred to as a brownout reference level, $U_{BOR}$, similarly described in reference to FIG. 1. An output 462 of comparator 414 is the brownout indicator signal, $U_{BO}$, again similarly described in reference to FIG. 1. Comparator 414 is powered by the power supply voltage $V_{CC}$ 422 at terminal 464 and is grounded at the power supply ground 432 at terminal 466.

The equations for the current through a diode, $I(V_D, T)$, and the voltage across a diode, $V_D(T)$, can be applied to the temperature compensating brownout circuit 400. The current flowing through resistor $R_1$ 404 and resistor $R_3$ 408 can be temperature dependent. Selecting the value of resistor $R_1$ 404 and resistor $R_3$ 408 equal to each other, the brownout reference level is found as follows:

$$U_{BOR} = \left(\frac{R_4}{R_5}+1\right) \cdot \left[k_B \cdot \frac{T}{q} \cdot \ln(A) \cdot \frac{R_3}{R_2} + k_1 \cdot (T-T_0) + V_{D0}\right] + \frac{2}{R_2} \cdot k_B \cdot \frac{T}{q} \cdot \ln(A) \cdot R_4$$

where

Boltzmann's constant, $k_B = 1.38 \cdot 10^{-23}$

Electron voltage, $q = 1.6 \cdot 10^{-19}$

Temperature, T

Room temperature, $T_0 = 300$ K

Diode voltage at room temperature (process dependent), $V_{D0} = 0.65$ V

Diode voltage temperature gradient (process dependent), $k_1 = -2$ mV/K

Ratio between diodes (which may be selected by designer), $A = 10$

The resulting brownout reference level, $U_{BOR}$, is independent of temperature. Therefore, $$\frac{d}{dT} U_{BOR} = 0$$

and after rewriting and collecting the temperature dependent terms $$U_{BOR} = \left[\left(\frac{R_4}{R_5}+1\right) \cdot \left(\frac{k_B}{q} \cdot \ln(A) \cdot \frac{R_3}{R_2} + k_1\right) + \frac{2}{R_2} \cdot \frac{k_B}{q} \cdot \ln(A) \cdot R_4\right] \cdot T + \left(\frac{R_4}{R_5}+1\right) \cdot [(-k_1) \cdot T_0 + V_{D0}]$$

one may derive a temperature insensitive level:

$$\frac{d}{dT} U_{BOR} = 0 = > \left(\frac{R_4}{R_5}+1\right) \cdot \left(\frac{k_B}{q} \cdot \ln(A) \cdot \frac{R_3}{R_2} + k_1\right) + \frac{2}{R_2} \cdot \frac{k_B}{q} \cdot \ln(A) \cdot R_4 = 0$$

Because the temperature dependent terms are set to zero, the brownout reference level, $U_{BOR}$, can be as follows:

$$U_{BOR} = \left(\frac{R_4}{R_5}+1\right) \cdot [(-k_1) \cdot T_0 + V_{D0}]$$

where

Boltzmann's constant, $k_B = 1.38 \cdot 10^{-23}$

Electron voltage, $q = 1.6 \sim 10^{-19}$

Room temperature, $T_0 = 300$ K

Diode voltage at room temperature (process dependent), $V_{D0} = 0.65$ V

Diode voltage temperature gradient (process dependent), $k_1 = -2$ mV/K

Ratio between diodes (chosen by designer), $A = 10$

The current through the diodes, $D_1$ 410 and $D_2$ 412, can be selected in the temperature compensating brownout circuit 400 as a design parameter. Therefore, resistor $R_2$ 406 can be determined by the following equation:

$$R_2 = \frac{\ln(A)}{I_2} \cdot \left(k_B \cdot \frac{T_0}{q}\right)$$

where

Boltzmann's constant, $k_B = 1.38 \cdot 10^{-23}$

Electron voltage, $q = 1.6 \cdot 10^{-19}$

Room temperature, $T_0 = 300$ K

Current through the resistor $R_2$ 406 and the diodes, $D_1$ 410 and $D_2$ 412, when the power supply voltage $V_{CC}$ 422 is at the brownout reference level, $U_{BOR}$, $I_2$ Ratio between diodes (chosen by designer), $A = 10$ After the value of resistor $R_2$ 406 is determined, the relationship between resistors $R_3$ 408, $R_4$ 416, and $R_5$ 430 can be determined by using the equations previously described for the brownout reference level, $U_{BOR}$.

The minimum value resistor $R_4$ 416 can have is zero. This, in turn, results in a maximum value for resistor $R_3$ 408 as shown in the following equation:

$$R_{3MAX} = (-k_1) \cdot R_2 \cdot \frac{q}{k_B \cdot \ln(A)}$$

where
Boltzmann's constant, $k_B$=1.38·10$^{-23}$
Electron voltage, q=1.6·10$^{-19}$
Diode voltage temperature gradient (process dependent), $k_1$=−2 mV/K
Ratio between diodes (chosen by designer), A=10

In some embodiments, the resistor $R_3$ 408 is chosen to have a large value. However if the value of resistor $R_3$ 408 is chosen to be too large, the value of resistor $R_4$ 416 can be too small. This can result in a large amount of power consumption for the temperature compensating brownout circuit 400. The temperature compensating brownout circuit 400 can be designed to have favorable sensitivity to a change in the power supply voltage $V_{CC}$ 422 at node 440. In one implementation, this is accomplished by selecting a large value for resistor $R_3$ 408. The following equation can characterize this sensitivity:

$$\text{Sensitivity} = \frac{d}{dV_{CC}} U_1$$

where
$U_1$ is the voltage level at node 440.
which implies that:

$$\text{Sensitivity} = \frac{2 \cdot (k_1 \cdot T_0 - V_{D0})}{U_{BOR} \cdot \left( \frac{2}{k_B \cdot \ln(A)} \cdot k_1 \cdot q + \frac{R_2}{R_3 \cdot k_B \cdot \ln(A)} \cdot k_1 \cdot q - 1 \right)}$$

where
Boltzmann's constant, $k_B$=1.38·10$^{-23}$
Electron voltage, q=1.6·10$^{-19}$
Room temperature, $T_0$=300 K
Diode voltage at room temperature (process dependent), $V_{D0}$=0.65 V
Diode voltage temperature gradient (process dependent), $k_1$=−2 mV/K
Ratio between diodes (chosen by designer), A=10

Once the values of resistors $R_2$ 406 and $R_3$ 408 are determined, the values for resistors $R_4$ 416, and $R_5$ 430 can be determines as shown in the following equations:

$$R_4 = U_{BOR} \cdot \frac{k_B \cdot \ln(A) \cdot R_3 + k_1 \cdot q \cdot R_2}{2 \cdot (k_1 \cdot T_0 - V_{D0}) \cdot k_B \cdot \ln(A)}$$

$$R_5 = \frac{-1}{2} \cdot U_{BOR} \cdot \frac{k_B \cdot \ln(A) \cdot R_3 + k_1 \cdot q \cdot R_2}{k_B \cdot \ln(A) \cdot (U_{BOR} + k_1 \cdot T_0 - V_{D0})}$$

where
Boltzmann's constant, $k_B$=1.38·10$^{-23}$
Electron voltage, q=1.6·10$^{-19}$
Room temperature, $T_0$=300 K
Diode voltage at room temperature (process dependent), $V_{D0}$=0.65 V
Diode voltage temperature gradient (process dependent), $k_1$=−2 mV/K
Ratio between diodes (chosen by designer), A=10
Brownout reference level, $U_{BOR}$ For example, the temperature compensating brownout circuit 400 can be designed with a brownout reference level, $U_{BOR}$, of substantially 3.5 volts. The temperature compensating brownout circuit 400 can be designed with a current, I2, through the diodes $D_1$ 410 and $D_2$ 412 and the resistor $R_2$ 406 equal to 1 uAmp. The value of resistor $R_2$ 406 can be calculated to be:

$$R_2 = \frac{\ln(A)}{I_2} \cdot \left( k_B \cdot \frac{T_0}{q} \right) = 60 \text{ kOhm}$$

where
Boltzmann's constant, $k_B$=1.38·10$^{-23}$
Electron voltage, q=1.6·10$^{-19}$
Room temperature, $T_0$=300 K
Ratio between diodes (chosen by designer), A=10
$I_2$=1 uAmp=1×10−6

The maximum value of resistor $R_3$ 408 can be calculated to be:

$$R_{3MAX} = (-k_1) \cdot R_2 \cdot \frac{q}{k_B \cdot \ln(A)} = 600 \text{ kOhm}$$

where
Boltzmann's constant, $k_B$=1.38·10$^{-23}$
Electron voltage, q=1.6·10$^{-19}$
Ratio between diodes (chosen by designer), A=10
Diode voltage temperature gradient (process dependent), $k_1$=−2 mV/K $R_2$=60 kOhm, as determined above As described above, the value of resistor $R_3$ 408 can be selected to be large. This can result in the value of resistor $R_4$ 416 becoming too small, which may cause the circuit to have a large power consumption. Therefore, the value of resistor $R_3$ 408 may be selected to be less than its maximum calculated value, 600 kOhm. In one example, $R_3$ 408 is selected to be 500 kOhm. The value of resistors $R_4$ 416, and $R_5$ 430 can be calculated using the following equations:

$$R_4 = U_{BOR} \cdot \frac{k_B \cdot \ln(A) \cdot R_3 + k_1 \cdot q \cdot R_2}{2 \cdot (k_1 \cdot T_0 - V_{D0}) \cdot k_B \cdot \ln(A)} = 140 \text{ kOhm}$$

$$R_5 = \frac{-1}{2} \cdot U_{BOR} \cdot \frac{k_B \cdot \ln(A) \cdot R_3 + k_1 \cdot q \cdot R_2}{k_B \cdot \ln(A) \cdot (U_{BOR} + k_1 \cdot T_0 - V_{D0})} 78 \text{ kOhm}$$

where
Boltzmann's constant, $k_B$=1.38·10$^{-23}$
Electron voltage, q=1.6∼10$^{-19}$
Ratio between diodes (chosen by designer), A=10
Room temperature, $T_0$=300 K
Diode voltage at room temperature (process dependent), $V_{D0}$=0.65 V
Diode voltage temperature gradient (process dependent), $k_1$=−2 mV/K
$R_2$=60 kOhm, as determined above
$R_3$=500 kOhm, as selected above
Brownout reference level, $U_{BOR}$=3.5 volts The sensitivity can then be calculated using the following equation:

Sensitivity=

-continued $$\frac{2 \cdot (k_1 \cdot T_0 - V_{D0})}{U_{BOR} \cdot \left( \frac{2}{k_B \cdot \ln(A)} \cdot k_1 \cdot q + \frac{R_2}{R_3 \cdot k_B \cdot \ln(A)} \cdot k_1 \cdot q - 1 \right)} = 32 \text{ mV/V}$$

where

Boltzmann's constant, $k_B = 1.38 \cdot 10^{-23}$
Electron voltage, $q = 1.6 \cdot 10^{-19}$
Ratio between diodes (chosen by designer), $A=10$
Room temperature, $T_0 = 300$ K
Diode voltage at room temperature (process dependent), $V_{D0} = 0.65$ V
Diode voltage temperature gradient (process dependent), $k_1 = -2$ mV/K
$R_2 = 60$ kOhm, as determined above
$R_3 = 500$ kOhm, as selected above
Brownout reference level, $U_{BOR} = 3.5$ volts Therefore, if the power supply voltage $V_{CC}$ 422 changes by 1 volt, the voltage level at node 440, which is coupled to the negative input 458 of comparator 414, will change by 32 mV. The sensitivity can be used to select the design constraints for the comparator 414.

Figure 5:
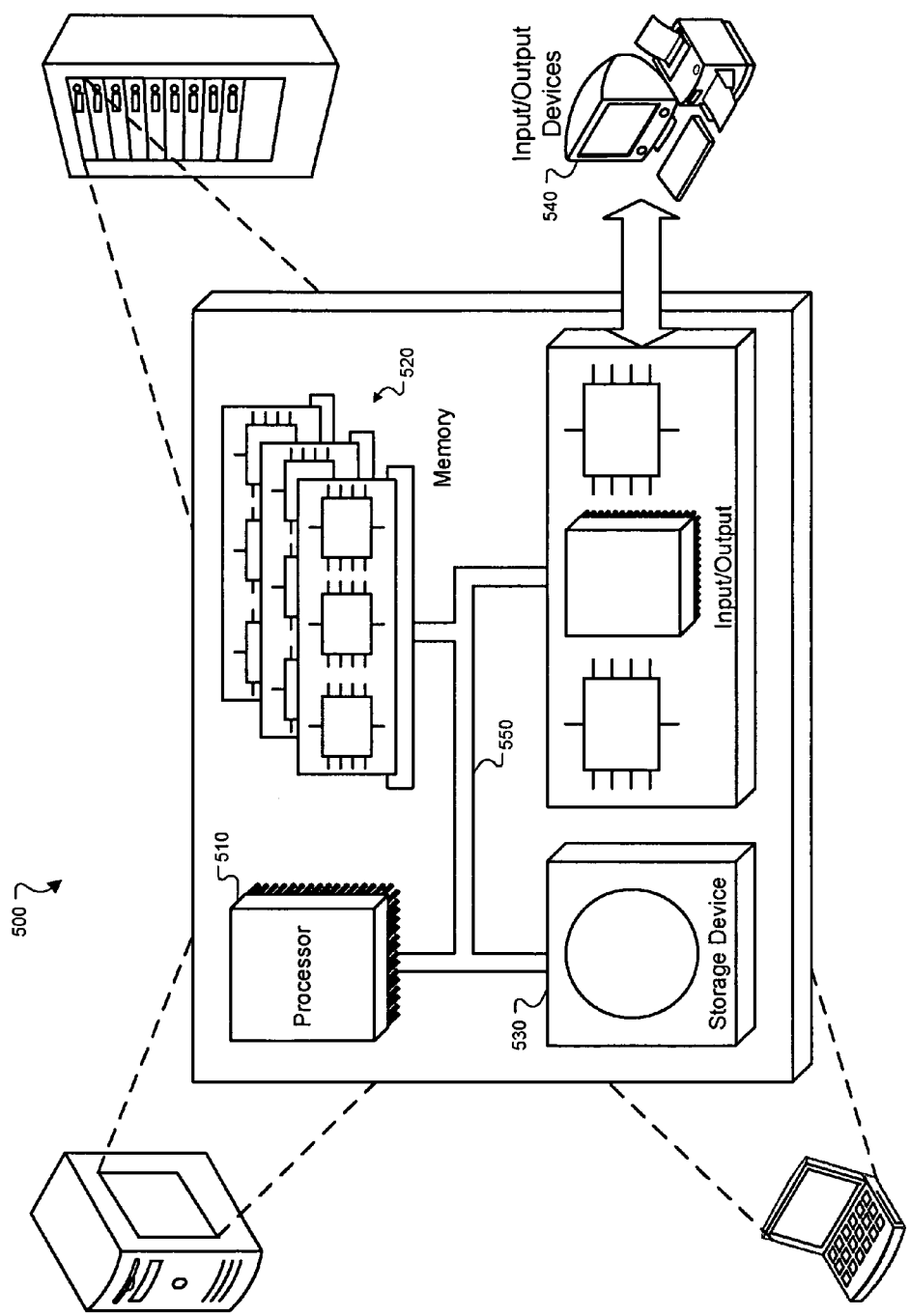
FIG. 5 is a schematic diagram of a general computer system.

The brown out device may be included in a system, such as the system 500 shown in FIG. 5. The system 500 includes a processor 510, a memory 520, a storage device 530, and one or more input/output devices 540. Each of the components 510, 520, 530, and 540 can be interconnected using a system bus 550. In some implementations, the processor 510 is capable of processing instructions for execution within the system 500. For example, the processor 510 can be the processing unit 108 that executes instructions that carry out the optional step 212 of the method 200. The brownout detector 106 may be integrated into the system 500 so that it monitors the power supply voltage provided to the processor 510, the memory 520, the storage device 530 or the I/O devices 540.

In some implementations, the processor 510 is a single-threaded processor. In other implementations, the processor 510 is a multi-threaded processor. The processor 510 is capable of processing instructions stored in the memory 520, or on the storage device 530. In some implementations, the processed instructions may generate graphical information for a user interface, on one of the input/output devices 540.

The memory 520 stores information within the system 500. In some implementations, the memory 520 is a computer-readable medium. In some implementations, the memory 520 is a volatile memory unit. In other implementations, the memory 520 is a non-volatile memory unit.

The storage device 530, such as the memory 106, is capable of providing mass storage for the system 100. In some implementations, the storage device 530 is a computer-readable medium. In various different implementations, the storage device 530 may be a floppy disk device, a hard disk device, an optical disk device, or a tape device.

The input/output devices 540 provide input/output operations for the system 500. In some implementations, the input/output devices 540 include a keyboard and/or pointing device. In other implementations, the input/output devices 540 include a display unit for displaying graphical user interfaces.

The features described can be implemented in digital electronic circuitry, or in computer hardware, firmware, software, or in combinations of them. The apparatus can be implemented in a computer program product tangibly embodied in an information carrier, e.g., in a machine-readable storage device or in a propagated signal, for execution by a programmable processor; and method steps can be performed by a programmable processor executing a program of instructions to perform functions of the described implementations by operating on input data and generating output. The described features can be implemented advantageously in one or more computer programs that are executable on a programmable system including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, and the sole processor or one of multiple processors of any kind of computer. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

To provide for interaction with a user, the features can be implemented on a computer having a display device such as a CRT (cathode ray tube) or LCD (liquid crystal display) monitor for displaying information to the user and a keyboard and a pointing device such as a mouse or a trackball by which the user can provide input to the computer.

The components of the system can be connected by any form or medium of digital data communication such as a communication network. Examples of communication networks include, e.g., a LAN, a WAN, and the computers and networks forming the Internet.

A number of embodiments have been described. Nevertheless, it will be understood that various modifications may be made without departing from the spirit and scope of the subject matter. For example, the comparator 112, described in reference to FIG. 1, can determine when the divided power supply voltage level rises above the temperature compensated voltage reference. When this occurs, the output 116 of the comparator 112 will transition from a first voltage level, for example zero volts, to a second voltage level, for example 2.5 volts, indicating the application of power to the computing device 104. The computing device 104 can use this indicator to power up and reset its components. In yet other implementations, the power supply voltage is not divided before it is input into the comparator. Additionally, the grounds 330 and 432 of FIGS. 3 and 4, respectively can be floating grounds instead of power supply grounds. Accordingly, other embodiments are within the scope of the following claims.

What is claimed is:

1. A brownout detection circuit comprising:
   a comparator to detect a crossing of a brownout threshold that is specified by a reference voltage, wherein the comparator has a first and a second input; and
   a temperature compensating circuit having two branches connected in parallel, a first branch to provide the reference voltage substantially independent of temperature and a second branch to provide an indication of a supply voltage, wherein the first branch is coupled to the first input and the second branch is coupled to the second input.

2. The detection circuit of claim 1, wherein the temperature compensating circuit further comprises a third branch having components to adjust the reference voltage.

3. The detection circuit of claim 2, wherein the components include two resistors in series.

4. The detection circuit of claim 3, wherein the third branch is coupled to the first and second branch at a node between the resistors.

5. The detection circuit of claim 1, wherein the first branch comprises a first resistor and a second resistor in series.

6. The detection circuit of claim 5, wherein the first branch is coupled to the first input at a first node between the first and second resistors.

7. The detection circuit of claim 5, wherein the first branch further comprises a first diode coupled in series with the second resistor and having its cathode grounded.

8. The detection circuit of claim 1, wherein the first input of the comparator is a negative input or an inverting input.

9. The detection circuit of claim 1, wherein the second branch comprises a third resistor.

10. The detection circuit of claim 9, wherein the second branch further comprises a second diode in series with the third resistor and having its cathode grounded.

11. The detection circuit of claim 10, wherein the second branch is coupled to the second input at a second node between the third resistor and the second diode.

12. The detection circuit of claim 1, wherein the second input of the comparator is a positive input or a non-inverting input.

13. The detection circuit of claim 1, wherein the first branch comprises a first resistor, a second resistor, and a first diode coupled in series, and the second branch comprises a third resistor and a second diode coupled in series, wherein the first and second branches are coupled at a node between the first resistor and the third resistor.

14. The detection circuit of claim 13, further comprising a third branch coupled to the first and second branches, the third branch having a fourth resistor, a fifth resistor, and a node between the fourth and fifth resisters that is coupled to the node between the first resistor and the third resistor.

15. The detection circuit of claim 14, wherein a relationship between the resistors and the diodes is expressed by $$\left(\frac{R_4}{R_5}+1\right)\cdot\left(\frac{k_B}{q}\cdot\ln(A)\cdot\frac{R_3}{R_2}+k_1\right)+\frac{2}{R_2}\cdot\frac{k_B}{q}\cdot\ln(A)\cdot R_4 = 0,$$

where $k_B$ is Boltzmann's constant, q is an electron charge constant, A is a ratio between the diodes, and $k_1$ is a voltage temperature gradient of the diodes.

16. The detection circuit of claim 15, wherein the second resistor has a resistance value of $$R_2 = \frac{\ln(A)}{I_2}\cdot\left(k_B\cdot\frac{T_0}{q}\right),$$

where $I_2$ is a value of a current passing through the second resistor, and $T_0$ is a temperature of an environment surrounding the temperature compensating circuit.

17. The detection circuit of claim 16, wherein the third resistor has a maximum resistance value of $$R_{3MAX} = (-k_1)\cdot R_2 \cdot \frac{q}{k_B\cdot\ln(A)}.$$

18. The detection circuit of claim 17, wherein the fourth resistor has a resistance value of $$R_4 = V_{REF}\cdot\frac{k_B\cdot\ln(A)\cdot R_3 + k_1\cdot q\cdot R_2}{2\cdot(k_1\cdot T_0 - V_{D0})\cdot k_B\cdot\ln(A)},$$

where $V_{REF}$ is the voltage reference, $T_0$ is a temperature of an environment surrounding the temperature compensating circuit, and $V_{D0}$ is a voltage of the diodes at the temperature of the environment.

19. The detection circuit of claim 17, wherein the fifth resistor has a resistance value $$R_5 = \frac{-1}{2}\cdot\frac{k_B\cdot\ln(A)\cdot R_3 + k_1\cdot q\cdot R_2}{k_B\cdot\ln(A)\cdot(V_{REF}+k_1\cdot T_0 - V_{D0})},$$

where $V_{REF}$ is the voltage reference, $T_0$ is a temperature of an environment surrounding the temperature compensating circuit, and $V_{D0}$ is a voltage of the diodes at the temperature of the environment.

20. A method for brownout detection comprising:
    setting a brownout threshold voltage using a first branch of a temperature compensating circuit, wherein the brownout threshold voltage is substantially independent of temperature changes;
    providing a second voltage using a second branch of the temperature compensating circuit in parallel with the first branch, wherein the second voltage indicates a power supply voltage; and
    generating a signal from a comparator when the second voltage crosses the brownout threshold voltage, wherein the brownout threshold voltage is coupled to a first input of the comparator and the second voltage is coupled to a second input of the comparator.

21. The method of claim 20, further comprising selecting the brownout threshold voltage.

22. A circuit comprising:
    a detection component to detect a crossing of a reference voltage by an input voltage; and
    a temperature compensating circuit to generate the reference voltage, the temperature compensating circuit comprising two circuit branches connected in parallel and separately coupled to the detection component,
    a first circuit branch to generate the reference voltage being substantially independent of temperature, and
    a second circuit branch to generate the input voltage.

23. A method for brownout detection comprising:
setting a brownout threshold voltage,
maintaining the brownout threshold voltage substantially independent of temperature changes including compensating temperature changes in parallel circuit elements to substantially maintain the brownout threshold voltage at a substantially constant level;
evaluating a second voltage indicative of a power supply voltage; and
generating a signal when the second voltage crosses the brownout threshold voltage.

* * * * *

UNITED STATES PATENT AND TRADEMARK OFFICE
CERTIFICATE OF CORRECTION

| | | |
|---|---|---|
| PATENT NO. | : 7,274,999 B1 | Page 1 of 1 |
| APPLICATION NO. | : 11/373050 | |
| DATED | : September 25, 2007 | |
| INVENTOR(S) | : Terje Saether | |

It is certified that error appears in the above-identified patent and that said Letters Patent is hereby corrected as shown below:

Title Page, (65) Prior Publication Data, please insert

-- US   2007/0213946   A1   Sept. 13, 2007 --.

Signed and Sealed this

Nineteenth Day of August, 2008

JON W. DUDAS
*Director of the United States Patent and Trademark Office*